(12) United States Patent
Robinson et al.

(10) Patent No.: US 6,279,069 B1
(45) Date of Patent: *Aug. 21, 2001

(54) INTERFACE FOR FLASH EEPROM MEMORY ARRAYS

(75) Inventors: Kurt B. Robinson, Newcastle; Mark Christopherson, Folsom; Terry Kendall, Diamond Springs, all of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/773,169

(22) Filed: Dec. 26, 1996

(51) Int. Cl.[7] ....................................................... G06F 12/00
(52) U.S. Cl. ............................. 711/103; 710/10; 711/171; 711/172
(58) Field of Search .................................... 711/103, 100, 711/154, 156, 172, 170, 171, 206–209; 365/230.01, 185.33; 707/205; 395/309; 710/10–16; 309/327

(56) References Cited

U.S. PATENT DOCUMENTS

| | | | |
|---|---|---|---|
| 3,723,975 | * 3/1973 | Kurtz, Sr. et al. | 714/55 |
| 5,053,990 | * 10/1991 | Kreifels et al. | 711/103 |
| 5,307,320 | * 4/1994 | Farrer et al. | 365/230.01 |
| 5,339,432 | * 8/1994 | Crick | 711/103 |
| 5,341,330 | 8/1994 | Wells et al. | 365/185.33 |
| 5,341,339 | 8/1994 | Wells | 365/185.11 |
| 5,353,256 | * 10/1994 | Fandrich et al. | 711/103 |
| 5,353,431 | 10/1994 | Doyle et al. | 711/206 |
| 5,375,222 | 12/1994 | Robinson et al. | 711/103 |
| 5,430,857 | 7/1995 | Kendall | 711/206 |
| 5,455,800 | 10/1995 | Wells et al. | 365/218 |
| 5,459,850 | 10/1995 | Clay et al. | 711/171 |
| 5,473,765 | 12/1995 | Gibbons et al. | 703/24 |
| 5,475,693 | 12/1995 | Christopherson et al. | 714/710 |
| 5,508,971 | 4/1996 | Cernea et al. | 365/185.23 |
| 5,524,231 | 6/1996 | Brown | 711/101 |
| 5,535,357 | 7/1996 | Moran et al. | 711/103 |
| 5,535,369 | 7/1996 | Wells et al. | 711/171 |

(List continued on next page.)

OTHER PUBLICATIONS

Designing With Flash Memory, Dipert et al., Annabooks, Sandiego, CA, pp. 349–371, Apr. 1994.*
Inside PC Card, Cardbus and PCMCIA Design, Faisal Imdad–Haque, Newnes, Newton, MA., pp. 67–115,1996.*
PCMCIA System Architecture, Don Anderson, MindShare, Inc., pp. 145–173, Jul. 1995.*
PCT/US97/18741—International Search Report, Feb. 25, 1998.
PCT/US97/19456—International Search Report, Mar. 20, 1998.

Primary Examiner—Matthew Kim
Assistant Examiner—Pierre-Michel Bataille
(74) Attorney, Agent, or Firm—Blakely, Sokoloff, Taylor & Zafman LLP

(57) ABSTRACT

A flash EEPROM memory device including a plurality of blocks of flash EEPROM memory cells arranged to be accessed in rows and columns, a query memory storing data defining characteristics of the flash memory device that may be used to initialize software device drivers for accessing the device, and an interface for receiving data and commands addressed to the blocks of flash EEPROM memory cells and generating signals for affecting the purpose of the commands in the flash EEPROM memory device, the interface adapted to receive a command scaled to a range of characteristics of a particular flash EEPROM memory device and respond by returning the data stored in the query memory as output depending on characteristics of the particular flash EEPROM memory device.

32 Claims, 4 Drawing Sheets

U.S. PATENT DOCUMENTS

| | | | |
|---|---|---|---|
| 5,541,886 | 7/1996 | Hasbun | 365/185.03 |
| 5,544,356 * | 8/1996 | Robinson et al. | 707/205 |
| 5,559,988 * | 9/1996 | Durante et al. | 711/152 |
| 5,563,828 * | 10/1996 | Hasbun et al. | 365/185.33 |
| 5,581,723 | 12/1996 | Hasbun et al. | 711/103 |
| 5,592,669 | 1/1997 | Robinson et al. | 707/206 |
| 5,598,540 | 1/1997 | Krueger | 710/104 |
| 5,603,001 * | 2/1997 | Sukegawa et al. | 711/103 |
| 5,611,067 * | 3/1997 | Okamoto et al. | 711/103 |
| 5,627,782 * | 5/1997 | Tanaka et al. | 365/185.22 |
| 5,627,784 * | 5/1997 | Roohparvar | 711/103 |
| 5,628,028 * | 5/1997 | Michelson | 710/8 |
| 5,630,093 | 5/1997 | Holzhammer et al. | 711/115 |
| 5,640,507 | 6/1997 | Lipe | 714/25 |
| 5,640,529 | 6/1997 | Hasbun | 711/103 |
| 5,661,677 | 8/1997 | Rondeau, II et al. | 365/63 |
| 5,668,976 | 9/1997 | Zook | 703/24 |
| 5,671,374 * | 9/1997 | Postman et al. | 710/129 |
| 5,671,388 | 9/1997 | Hasbun | 711/103 |
| 5,684,997 | 11/1997 | Kau et al. | 710/260 |
| 5,696,929 * | 12/1997 | Hasbun et al. | 711/103 |
| 5,727,057 | 3/1998 | Emery et al. | 379/211 |
| 5,740,395 | 4/1998 | Wells et al. | 711/103 |
| 5,754,567 | 5/1998 | Norman | 714/773 |
| 5,761,732 | 6/1998 | Shabeman et al. | 711/157 |
| 5,822,781 * | 10/1998 | Wells et al. | 711/171 |
| 5,822,782 | 10/1998 | Humlicek et al. | 711/170 |
| 5,835,772 * | 11/1998 | Thurlo | 717/5 |
| 5,867,641 | 2/1999 | Janett | 714/7 |
| 6,081,850 * | 6/2000 | Garney | 710/15 |

* cited by examiner

| SECTION NAME | OFFSET | LENGTH (BYTES) | DESCRIPTION |
|---|---|---|---|
| RESERVED | 00h | 2 | VENDOR SPECIFIC INFORMATION |
| BLOCK STATUS REG. | (BA+2)h | 2 | BLOCK SPECFIC INFORMATION |
| | | | BSRO=1 (BLOCK LOCKED)/=0 (BLOCK FUNCTIONAL) |
| | | | BRS1=1 (ERASE UNSUCCESSFULL)/=0 (ERASE SUCCESSFULL) |
| | | | BSR2-7 RESERVED |
| RESERVED | 04h | 12 | |
| CFI QUERY ID | 10h | 11 | COMMAND SET ID AND OEM DATA OFFSET |
| | 10h | 3 | ASCII "QRY" |
| | 13h | 2 | PRIMARY COMMAND SET CODE & ID CODE |
| | 15h | 2 | ADDRESS OF PRIMARY COMMAND SET CODE (OFFSET=P=031H) |
| | 17h | 2 | ALTERNATE COMMAND SET CODE & ID CODE |
| | 19h | 2 | ADDRESS OF ALTER. COMMAND SET CODE (OFFSET=A) |
| SYSTEM INTERFACE | 1Bh | 12 | DEVICE TIMING AND VOLTAGE INFORMATION |
| | 1Bh | 1 | $V_{CC}$ LOGIC WRITE/ERASE SUPPLY VOLTAGE MINIMUM |
| | 1Ch | 1 | $V_{CC}$ LOGIC WRITE/ERASE SUPPLY VOLTAGE MAXIMUM |
| | 1Dh | 1 | $V_{PP}$ PROGRAMMING SUPPLY VOLTAGE MINIMUM |
| | 1Eh | 1 | $V_{PP}$ PROGRAMMING SUPPLY VOLTAGE MAXIMUM |
| | 1Fh | 1 | TYPICAL TIME-OUT FOR SINGLE BYTE/WORD WRITE |
| | 20h | 1 | TYPICAL TIME-OUT FOR MAXIMUM SIZE BUFFER WRITE |
| | 21h | 1 | TYPICAL TIME-OUT FOR INDIVIDUAL BLOCK ERASE |
| | 22h | 1 | TYPICAL TIME-OUT FOR FULL CHIP ERASE |
| | 23h | 1 | MAXIMUM TIME-OUT FOR BYTE/WORD WRITE |
| | 24h | 1 | MAXIMUM TIME-OUT FOR BUFFER WRITE |
| | 25h | 1 | MAXIMUM TIME-OUT FOR INDIVIDUAL BLOCK ERASE |
| | 26h | 1 | MAXIMUM TIME-OUT FOR FULL CHIP ERASE |
| DEVICE GEOMETRY | 27h | 10 | FLASH DEVICE LAYOUT |
| | 27h | 1 | DEVICE SIZE |
| | 28h | 2 | FLASH DEVICE INTERFACE DESCRIPTION |
| | 2Ah | 2 | MAXIMUM BYTES IN MULTI-BYTE WRITE |
| | 2Ch | 1 | NUMBER OF ERASE BLOCK REGIONS IN DEVICE |
| | 2Dh | 4 | SIZE & NUMBER OF ERASE BLOCKS IN REGION |
| OEM EXTENDED INFO | 31h | VARIABLE | FEATURES OPTIONAL TO PARTICULAR OEM |
| | 31h | 3 | ASCII "PRI" |
| | 34h | 1 | MAJOR VERSION NUMBER |
| | 35h | 1 | MINOR VERSION NUMBER |
| | 36h | 4 | OPTIONAL FEATURES SUPPORTED |
| | 3Ah | 1 | FEATURES SUPPORTED DURING SUSPEND |
| | 3Bh | 2 | ACTIVE FUNCTIONS OF BLOCK STATUS REGISTER |
| | 3Dh | 1 | $V_{CC}$ OPTIMUM |
| | 3Eh | 1 | $V_{PP}$ OPTIMUM |
| | 3Fh | VARIABLE | RESERVED |
| OFFSET ADDRESS A | (A)h | VARIABLE | OPTIONAL EXTENDED ALTERNATE QUERY STRUCTURE |
| | (A)h | 3 | ASCII "ALT" |
| | (A+3)h | 1 | MAJOR VERSION NUMBER |
| | (A+4)h | 1 | MINOR VERSION NUMBER |
| | (A+5)h | VARIABLE | ALTERNATE EXTENDED QUERY TABLE CONTENTS |

FIGURE 4

INTERFACE FOR FLASH EEPROM MEMORY ARRAYS

FIELD OF THE INVENTION

This invention relates to flash electrically-erasable programmable read only memory ("EEPROM") and, more particularly, to methods and an apparatus for providing an interface for flash EEPROM memory arrays that allows determination of the characteristics of the memory array.

BACKGROUND OF THE INVENTION

Flash EEPROM memory arrays are being used for many purposes in present day digital systems (e.g., computers) because of the ability of flash EEPROM memory arrays to retain data when power is removed and to be easily reprogrammed without being removed from a system. A flash EEPROM memory array is comprised of floating gate field effect transistor devices arranged in row and column fashion. The charge stored on the floating gate of such a memory transistor may be changed by programming, and the state of the charge may be detected by sensing voltage across the device. Because these flash EEPROM arrays may be easily reprogrammed, they are being used as substitutes for normal EPROM arrays to provide read-only memory that may be easily updated.

A flash memory array is accessed for reading and writing in the same manner as are dynamic random access memory (DRAM) arrays using row and column addressing in byte, word, or larger sequences of bits. However, because of the manner in which data are stored, a flash memory array, unlike a typical DRAM device, cannot be overwritten without first erasing the memory cells. Flash memory arrays used as substitutes for EPROM arrays are typically erased in large blocks (that may constitute the entire array) before being reprogrammed.

Flash EEPROM memory arrays are also being used to provide smaller lighter functional equivalents of electromechanical hard disk drives. Flash memory arrays designed to replace hard disk drives (referred to herein as "flash disk drives") operate more reliably and are not as sensitive to physical damage as electromechanical hard disk drives. Because of these characteristics, flash disk drives are especially useful in portable computers where space is at a premium and weight is important.

Electro-mechanical disk drives have historically used an industry standard interface referred to as an "ATA interface." The ATA interface was specifically designed to provide communication between a computer system and a rotating electromechanical disk drive. Because of this, the ATA interface was defined in terms of primitive functions that are directly applicable to directly-overwritable, block read/write, rotating media. Such primitive functions include "do a slow seek for a logical address or a cylinder head sector," "read a sector or multiple sectors," and "write a sector."

On the other hand, exemplary flash EEPROM array primitive functions include "read and write at the byte, word, or small block level" and "erase at a large block level." The ATA interface does not communicate in flash memory array primitives. When a flash disk drive replaces an electromechanical disk drive, it uses the ATA interface to communicate with other computer components. Therefore, it has been necessary to provide circuitry by which the signals used by a computer to access electromechanical hard disk drives may be understood by the flash disk drive. The process of translating electromechanical rotating disk drive functions to flash disk drive functions has required a substantial amount of hardware and software.

For example, one type of flash disk drive interposes a command user interface on the same silicon substrate (chip) with the flash memory array to interpret the commands provided at the ATA interface. The flash disk drive command user interface accepts the ATA signals and controls the operations necessary to access the flash disk drive. The flash disk drive command user interface typically includes state machines that receive commands intended for a rotating disk, decode those commands, and generate commands adapted to carry out the purposes of the ATA commands within a flash disk drive.

Recently, there has appeared a lower cost alternative to a flash disk drive that combines disk emulation software running on a host computer with a low cost flash memory device array. The flash memory device array comprises one or more flash memory devices contained in one of several system packaging options, including a removable memory card, a system-resident single-in-line-memory module (SIMM), and a resident flash array (devices mounted directly on the system motherboard). The combination of any one of these plain flash memory device subsystems with disk emulation software is referred to in this specification as a flash disk emulator.

Many of the operations necessary for either a command user interface or a flash disk emulator to translate from commands phrased in primitives of a rotating disk are quite complicated. For example, in some flash disk drives and other flash memory devices data are first written to empty blocks of the memory array chosen under control of the command user interface; and then the physical address at which the data are stored is recorded in lookup tables along with the rotating disk addresses provided externally. This allows the data to be recovered when the rotating addresses are provided.

Early flash memory arrays addressed data in single bytes. As flash memory arrays have evolved, addressing in words and double words have become possible, often in the same array. The ability to provide these different forms of addressing have complicated the operations of the device command user interface. Recently, flash memory arrays have been devised that use buffering to allow the transfer of large amounts of data even though the array cannot immediately handle that data because of its slower combined erasing and writing speed. These enhancements increase the complexity of flash disk drive and flash emulator operations.

The basic requirement that flash memory be erased in large blocks further complicates operations that flash disk drives and flash disk emulators must carry out. When data are updated, stale data that cannot be overwritten must be marked invalid, the new data must be written to empty array space, and the address tables must be updated to provide a new physical address. This method of updating causes the data in a file to be written to discontiguous positions. When a sufficient amount of data in a large block becomes invalid, the remaining valid data must be copied to empty array space in some other block, the address tables must be updated, and the block must be erased to recover the array space. In prior art devices, this has required means for determining the status of individual blocks and cells of each device at all times.

The writing of flash EEPROM devices is slower than writing DRAM memory because storing data on the floating gate of a transistor requires substantial voltages and relatively long charging times. Both the writing process and the copy process are thus too long to be competitive with DRAM write times. A write state machine is typically positioned on the chip to assist a device command user interface and is used to conduct write and copy operations so that data are accurately stored without overwriting other data in the array. Moreover, the erase process (a process not required by DRAM or electromechanical memory) is typically slow, as long as one-half second for some flash drives. Because of this, the erase process is typically conducted as a background process run by the write state machine or by additional on-chip state machines under control of the flash disk drive firmware or flash disk emulator software operating beneath their respective command user interfaces. Substantial resources have been required to keep track of block status in order to accomplish these operations. The time required to conduct erase operations is such that some flash memory device command user interfaces accepts commands that suspend the erase operation to allow various other operations to occur.

Recently, flash memory arrays have been devised that allow the storage of more than one bit of data in a single memory cell. This has substantially increased the complication of the circuitry required to translate commands and data between the flash memory array and the ATA (flash disk drive) and flash disk emulator interfaces. As will be understood, all of this overhead is expensive and slows the operation of the flash memory array.

The ATA interface hides the complexity of the underlying flash disk drive internal software (firmware). A host system typically employs a single ATA device driver that translates instructions from the disk file system maintained by the operating system such as the boot parameter block/file allocation table ("BPB/FAT") file system in the Microsoft DOS and Windows operating systems. This driver is used by all ATA-compatible devices, both rotating and flash-based. The ATA interface was designed to provide forward and backward compatibility for all ATA devices without requiring software updates to the host system device driver. However, the ATA interface, as presently constituted, eliminates the ability to use the flash memory arrays for many operations for which transistor memory is especially well suited. For example, even though a flash memory array may inherently be accessed as rapidly as dynamic random access memory, direct random access is not possible using the ATA interface because of the translation overhead and because of the manner in which data are stored. Because the cells of flash memory arrays cannot be overwritten and consequently store file data in discontiguous positions of the flash array, a data file that is read from a flash memory array must be reassembled in main memory before it can be used. Because memory management of the flash memory array makes it necessary to reconstruct files read from flash memory devices in DRAM memory before use, direct execution of applications has been foreclosed in flash disk drives with an ATA interface.

Even if it were possible to store the portions of an application contiguously in a flash memory device, executing an application directly from a flash memory device would be very difficult. First, the ATA interface does not provide any direct access to the memory array for direct execution of instructions in the access time that a basic flash memory itself provides for read operations. Moreover, there is simply no manner of determining the characteristics of the particular flash memory device with which communication is being attempted so that communications can be carried on directly in terms by which the data in the array may be manipulated.

Because of these problems, flash disk drives have typically been used for long term storage of data where the ability to read and write data rapidly is not crucial.

Currently a flash disk emulator has strengths and weaknesses that contrast with those of an ATA-compatible flash drive. The flash disk emulator consists of a two-layer software driver and a memory card or other flash array. The upper level driver layer is referred to as a flash translation layer ("FTL") driver (PCMCIA specification release date May 1996) while each low level driver ("LLD") is usually designed by an original equipment manufacturer and is unique to the flash memory device and card combination. In addition to supporting disk emulation, the memory card or array can be partitioned in one or more additional regions that can support direct random memory access. Thus, a "plain" flash memory card or flash array allows the host system and its user to take advantage of fast direct access to the flash memory device contents in support of direct code execution.

The disadvantage of current flash disk emulator implementations is the custom nature of the low level driver. A low level driver currently reads a device identifier ("device ID") and refers to a lookup table to determine both a command sequence or algorithm and a set of card and/or device geometry and system interface parameters such as voltage and timing to be used with that device.

Such a driver has no way of determining the characteristics of any particular flash memory device with which it is associated except through the lookup table. Consequently, when a new flash memory device is introduced to the host system, the host cannot recognize the new device identifier and therefore cannot use the new card/device combination. This prevents forward compatibility and creates hardship for the typical flash card user who cannot easily find or implement the new required device driver. Because each low level driver must be written to include the particular disk emulator, each time an enhanced version of a flash memory device appears the low level driver must be rewritten to include the new features that the flash memory device offers. For example, drivers must be rewritten to include larger data words, increased buffer transfer size, and the like.

Furthermore, when a new device driver is being made available for the host system, the software writer faces code size and complexity constraints that may lead to a decision to drop older device algorithms. Hence, the new driver may sacrifice backward compatibility.

SUMMARY OF THE INVENTION

It is desirable to provide an interface for a flash storage device that allows communications with the flash memory array in the primitive terms used to control the flash memory array within such a flash storage device so that the device may be used for purposes for which transistor memory arrays are especially suited.

It is also desirable for devices using flash memory arrays to include a compatible interface by which the characteristics of the devices may be determined to provide initialization values for software drivers.

A device is described that includes a memory array, a query memory, and an interface. The memory array includes a plurality of blocks of flash EEPROM memory cells arranged to be accessed in rows and columns. The query memory stores data defining characteristics of the flash memory device. The interface receives data and commands addressed to the flash memory devices. The interface generates signals for effecting the purpose of the commands within the flash memory device. The interface includes circuitry for receiving a command scaled to a range of characteristics of a particular flash memory device and responding by returning data stored in the query memory as an output.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which the references indicate similar elements, and in which:

FIG. 4 is a diagram illustrating signals that may be returned in response to a query command with respect to a flash memory device.

DETAILED DESCRIPTION

As described in more detail below, an embodiment of the invention includes an interface for connecting a long term memory device including a flash EEPROM memory device array designed to accept a query command from other components of a computer system and return data that defines the physical properties and the functions of the flash memory device in terms that directly relate to a flash EEPROM memory array. The data derived by a query command may be used to initialize a system device driver to provide commands that most effectively manipulate data in the flash memory device.

Figure 1:
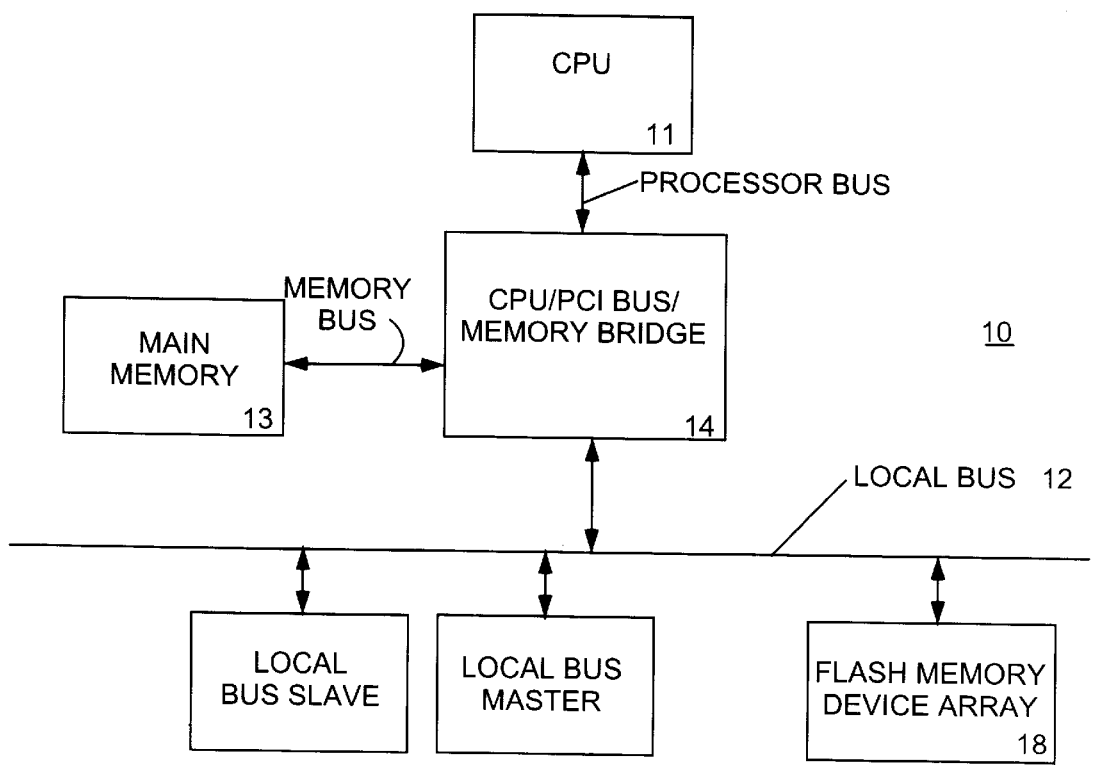
FIG. 1 is a block diagram of a computer system with a flash memory device array.

FIG. 1 is a block diagram of a computer system 10 configured in accordance with one embodiment of the present invention. For one embodiment, computer system 10 is a personal computer or a laptop computer. For other embodiments, computer system 10 resides within a cellular telephone, a digital camera, a personal digital assistant, or other apparatus under computer control. The system 10 illustrated includes a central processing unit ("CPU") 11 that executes the various instructions provided to control the operations of the system 10. For one embodiment, CPU 11 is a microprocessor. For other embodiments, CPU 11 is a microcontroller or other type of processor. CPU 11 is joined by a processor bus to a bridge circuit 14 that controls access to an input/output bus 12 adapted to carry information between the various components of the system 10. The bridge 14 is also joined by a memory bus to main memory 13 that is typically constructed of dynamic random access memory arranged to store information during a period in which power is provided to the system 10. In FIG. 1, the bus 12 is preferably a peripheral component interface ("PCI") bus or other local bus adapted to provide especially fast transfers of data.

For other embodiments, other types of buses may be used. Various input/output devices are connected as bus master and bus slave circuits to the bus 12. Flash memory device array 18 is connected to PCI bus 12. For an alternative embodiment, flash memory device array 18 is joined to a secondary bus (not shown), such as an Industry Standard Association ("ISA") bus or an Extended Industry Standard Association ("EISA") bus. For one embodiment, flash memory device array 18 uses the interface described in more detail below to connect to a bus.

Figure 2:
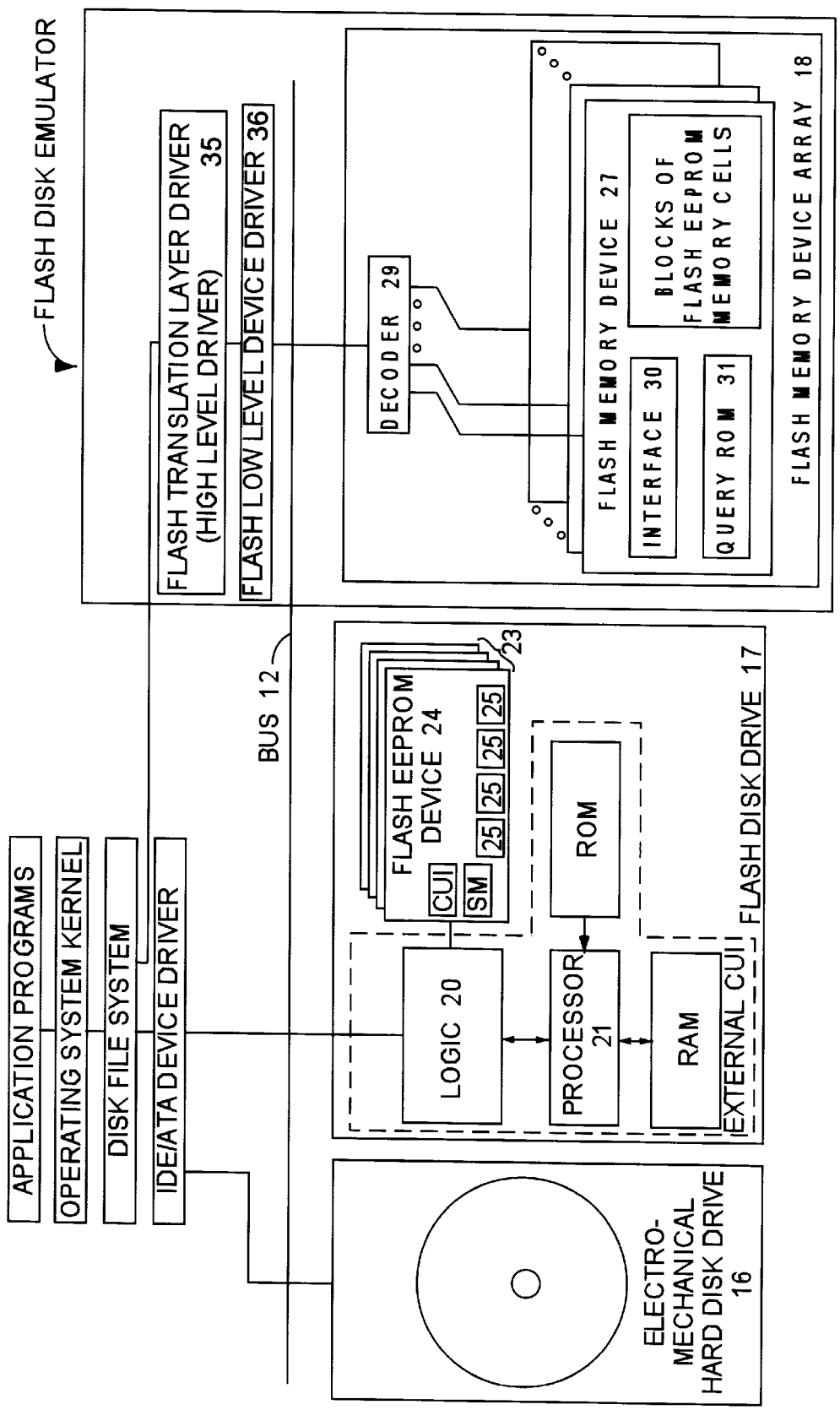
FIG. 2 is a block diagram of a prior art electromechanical hard disk drive, a prior art flash disk drive, and a flash memory device array designed in accordance with one embodiment of the present invention.

Flash memory device array 18 is a long term memory. Flash memory device array 18 may be a flash memory card or other type of flash memory array such as a single-in-line-memory module or a resident flash array. In the past, long term memory would typically be an electromechanical hard disk drive. However, a flash EEPROM memory array in the form of a flash disk drive or a flash memory device array may be used in place of such a hard disk drive as the long term memory. In order to illustrate differences from the prior art, FIG. 2 shows three types of long term memories coupled to bus 12, namely, a prior art electromechanical hard disk drive 16, a prior art flash disk drive 17, and a flash memory device array 18, the latter being one embodiment of the present invention. Flash memory device array 18 may be used as the long term memory in place of electromechanical hard disk drive 16. Flash memory device array 18 or any flash memory array may be one in which a memory cell stores a single bit of data or a multi-level memory system in which a memory cell may store more than one bit of data. A flash disk drive may include an array of one or more flash memory devices each having circuitry for reading, programming (writing), and erasing the cells of that flash memory device and circuitry external to the flash memory device for controlling the operations of the entire memory array. A flash disk emulator typically employs a flash memory device array that includes an array of one or more flash memory devices in which the circuitry for reading, programming, and erasing the cells of each flash memory device is contained completely within each such device.

FIG. 2 illustrates a system software/hardware interface provided at a bus 12 to which are coupled an ATA compatible electromechanical hard disk drive 16, the flash disk drive 17, and flash memory device array 18. FIG. 2 illustrates a software application program located in system memory executing on a computer microprocessor with the assistance of an operating system that controls access to various input/output devices of the computer. The operating system includes an operating system kernel that maintains a software disk file system in memory through which the various files are maintained. The operating system uses the disk file system to store and retrieve data from files kept in the memory system of the computer. When a file is stored on the electromechanical disk drive 16, the operating system transfers control to a software IDE/ATA device driver that is used to access the drive 16 and is maintained as a part of the operating system.

Similarly, if a file is stored on a flash disk drive 17, access is obtained through the operating system using the same IDE/ATA device driver. In the arrangement illustrated, the flash disk drive 17 receives commands and data related thereto from the ATA device driver defined in terms that are directly useful to a rotating electromechanical hard disk drive. Because an ATA device driver is designed to provide information for an electromechanical hard disk drive, the commands transferred to the flash disk drive 17 from the ATA device driver may direct that a seek operation for a particular rotating hard disk drive sector should be accomplished, that a read of one of more such sectors should occur, or that similar sector-related operations should take place.

The prior art flash disk drive 17 illustrated in FIG. 2 includes an array 23 of flash EEPROM memory devices that is designed to be accessed using chip, block, row, and column addressing. To deal with commands designed for a rotating disk device in accessing a row and column device, the flash disk 17 includes external command user interface ("CUI") circuitry for receiving and handling commands addressed to a plurality of silicon chips that together constitute a flash memory array 23. In one embodiment, this external command user interface circuitry includes an ASIC logic block 20 that receives commands furnished by the ATA device driver on the PCI bus 12. The logic block 20 is assisted by a processor 21 having associated random access memory and read only memory for assisting its operation. These together form what is in effect a small general purpose computer for carrying out the various operations directed to the flash disk drive 17. The logic block 20 accepts commands directed to that drive 17 and with the help of the processor 21 translates those commands and the associated addresses into information that is useful for accessing a row and column array. The logic block 20 and the processor 21 may be considered to function as an overall command user interface for the flash disk drive 17.

The flash memory array 23 shown includes flash EEPROM devices 24 each having a number of blocks 25 of memory transistors. One embodiment includes thirty-two individual large blocks, each having sixty-four kilobytes of flash EEPROM memory cells. Each device 24 also includes circuitry for controlling the application of signals and voltages to accomplish the read, write, copy, and erase functions in the individual blocks. Each flash EEPROM device 24 of the array 23 includes a command user interface ("CUI") and one or more state machines. A typical flash device command user interface is designed to receive all commands addressed to the individual flash device 24 from the logic block 20 no matter what their address on the device and use those commands to carry out the different operations commanded. The flash device CUI often uses a write state machine to control write, copy, and erase operations and certain other internal operations of the memory devices of the flash device.

Thus, the command user interfaces within each of the flash memory devices 24 are typically used for erasing the blocks 25 of cells and reading or writing data in row and column addresses while the ATA command user interface (including logic block 20 and processor 21) external to the devices 24 deals in cylinder/head/sector or logical block address representative of a mechanical disk drive.

Prior art flash disk emulators (although not shown in FIG. 2) include a low level driver between the IDE/ATA device driver and the emulator that performs the functions performed in the flash disk drive 17 by the external command user interface made up of the logic block 20 and the processor 21 and associated memory for translating the ATA commands to commands that may be carried out by a row and column array. As pointed out above, such a low level driver is not forward compatible and thus will not function with new flash disk emulators as they appear.

In accordance with one embodiment of the present invention, an apparatus and a method are provided for directly defining the characteristics of flash storage devices in terms of flash EEPROM primitives rather than rotating disk primitives as they have been defined in prior art arrangements. This allows direct access of a flash memory array for reading and executing the data stored therein using software drivers initialized by values obtained as a result of a query function provided by the flash storage device.

In FIG. 2, a new high level software driver 35 is provided as a part of the operating system. This software driver (called a flash translation layer (FTL) driver) translates the information provided from the disk file system to flash EEPROM primitives. The high level driver 35 provides addresses and data to a low level driver 36 particularly adapted to function with the flash device provided. The low level driver 36 provides many of the functions heretofore provided by the command user interface 20 of the flash disk drive 17. These software drivers and an array of directly accessible flash memory devices combine to form a flash disk emulator for the portions of the array formatted for use as general purpose data storage under control of the flash translation layer (FTL) driver. Other portions, or partitions, of such resident flash memory arrays or flash memory cards designed in accordance with the present invention may be formatted for other purposes such as storing code that may be directly executed by the host computer.

As may be seen in FIG. 2, the flash memory device array 18 includes a plurality of individual flash EEPROM memory devices 27 and a decoder 29 for directing commands to memory cells in blocks of particular devices 27. The flash memory device array 18 and the two software drivers 35 and 36 together form the flash disk emulator of the present invention (shown enclosed in dotted lines in the figure). As explained with respect to prior art flash disk emulators, various functions included in hardware in the flash disk drive 17 have been replaced by functions within the high and low software drivers. These typically include those required to accomplish translation from ATA primitives to flash memory primitives.

Figure 3:
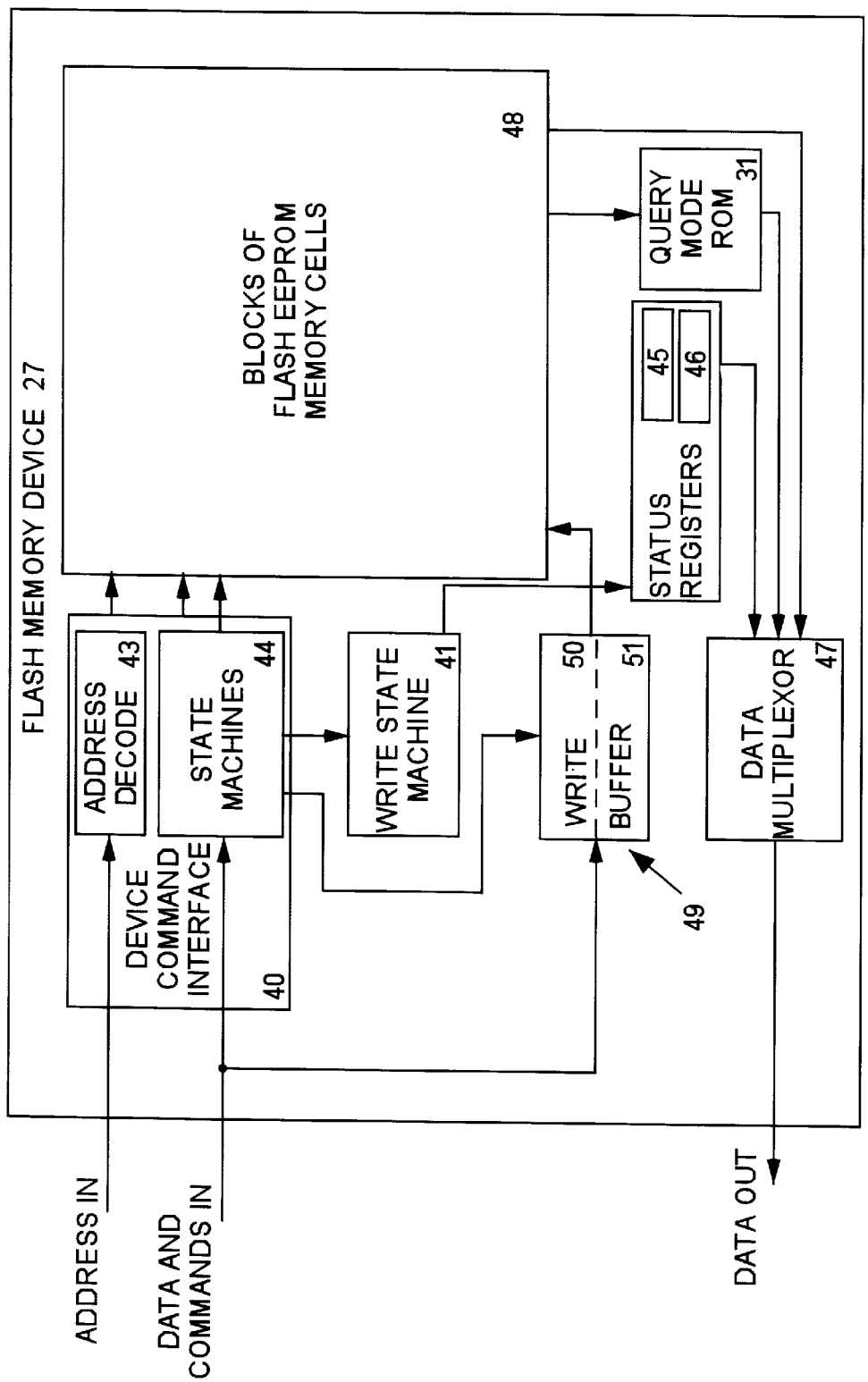
FIG. 3 is a block diagram of a flash memory device.

FIG. 3 illustrates of a flash memory device 27 built in accordance with one embodiment the present invention. The flash memory device 27 of FIG. 3 includes a device command interface 40 with address decode circuitry 43 and state machines 44. An additional write state machine 41 is associated with the command user interface to assist in programming and erasing the cells of blocks of flash EEPROM memory cells 48. A write buffer 49 is provided by which data is furnished to the blocks of flash memory cells 48. A status register 46 provides operational status of the device 27 and a data multiplexor 47 controls transfer of data out of the device 27.

The flash memory device 27 also includes an identification/query mode read only memory ("ROM") 31 in which are stored details of the characteristics of the particular flash memory cell technology and control circuitry of each flash memory device 27. The identification/query mode ROM 31 responds to a query command provided as a portion of the high level device driver software 35 and decoded by the device command user interface 40.

The device drivers 35 and 36 provide an algorithm for interfacing with the flash memory device 27 that may include a command set. The commands of the basic command set may include a query command, a read command, a write command, a read status command, an erase command, and a suspend command. The command set may also include additional commands adapted to be carried out by the various circuitry under control of these device drivers.

A query command directed to an address decoder 29 causes the ROM 31 to provide data that indicate the physical parameters of the flash disk device. FIG. 4 illustrates data that may be returned by a query command.

For one embodiment of the flash memory device 27, the high level driver 35 receives commands that are translated and sent to the low level driver 36. All of this command data is provided to the low level driver 36 by the high level driver 35 in terms of flash memory device primitives that require no further translation to be used with a flash memory device.

Normally the low level driver 36 maintains the flash memory device 27 in an array read mode. However, a valid command may switch any device 27 to another mode. When a read query command is directed to the low level driver 36, the driver sends a query command to the device command user interface 40 that causes the interrogation of the query mode ROM 31 and the return of the query data. Typically, the query data returned in response to the query command is provided in serial sequence. This data may then be used to initialize the high and low level software drivers 35 and 36 used with the flash memory device array 18 so that the commands used by the drivers match the capabilities of the flash memory device 27. This allows uniform drivers to be implemented that may be updated by improved versions of flash memory device arrays as those improved arrays are devised.

FIG. 4 illustrates one embodiment of data that may be stored in a query ROM 31 and returned in response to a query command received at the command user interface 40. The data may be returned in a serial string in which a first two bytes are reserved for the transfer of data specific to a particular flash memory vendor. A next two bytes are used to transfer data illustrating how the condition of blocks is described in a block status register. In the particular instance, the information illustrates how a locked block is described, how the success of an erase operation is conveyed, and leaves reserved space for additional information to be included in that register. A next twelve bytes is then allotted for additional reserved space.

A next eleven bytes are used to transfer data describing a particular command set available to be used with the flash array. Of this eleven bytes of data, a first three bytes are used to transfer a query string indicator such as the ASCII value for "QRY." This indicates to the computer that the array is able to accept and is responding to the query command. A next two bytes are used to transfer a sixteen bit identification code defining a specific generic vendor command set used by this particular flash memory device 27. In general, such a command set is a defined command set that is available as a standard to any vendor for use in a device driver. Such a command set may be used by one or more than one vendor but specifies exactly the basic commands with which the interface functions. The next two bytes then transfer an address for an extended portion of generally unlimited extent that may add to the command set defined by the last two bytes. In the embodiment described, this extended portion resides at an offset 31h as will be seen in the following description. This address allows a vendor to add additional commands to the primary command set for the flash memory device 27. In general, such additional commands are defined in the same manner as are the commands available in generic command sets of the device drivers. In this manner, a vendor may add commands specific to the flash memory device to be implemented by the device driver. A next two bytes are used to transfer sixteen bits of data indicating a second generic command set that may be implemented by the flash memory device 27 as an alternate command set. A last two bytes are used to transfer the address for extensions to this alternate command set for the flash memory device 27.

This arrangement allows a vendor to use a primary basic set of commands for operating the array, to add additional commands to the primary basic set of commands for the array, to use a second basic set of commands for operating the array, and to add additional commands to the second basic set of commands for the array. This allows a vendor to add additional commands as improvements are added to the flash memory device 27. The data transferred in response to the query command then allows a device driver to be modified to provide an appropriate command set for implementing the operations of the array.

FIG. 4 also illustrates another twelve bytes that provide a description of the system interface and are returned in response to a query command. For the embodiment illustrated, a first byte defines the minimum power supply voltage used with the array in its normal operating condition. A second byte defines the maximum power supply voltage used with the array in its normal operating condition. A third byte defines the minimum power supply voltage used with the array in its programming condition. A fourth byte defines the maximum power supply voltage used with the array in programming condition. The next eight bytes define various system timing parameters for byte write, page buffer write, block erase, and chip erase operations. As may be seen, these include typical and maximum time-out values for single byte/word write, for maximum-size buffer write, for individual block erase, and for full chip erase.

These values allow the initialization of device drivers to provide correct values for each of the particular operations that the array implements in carrying out its read, write, copy, and erase functions.

FIG. 4 also illustrates an additional ten bytes that may be used for the embodiment illustrated to transfer data defining the particular geometry of the flash memory device 27. For this embodiment, a first byte is used to define the device size in number of bytes. A second two bytes are used to describe the interface, e.g., asynchronous 8 bits, asynchronous 16 bits, or both. A third two bytes defines the maximum size of a multi-byte write. A next byte defines the number of individual erase block regions in a device; these are a number of erase blocks that may be erased together. Such erase block regions may also be locked together in an operation called block locking to make the one or more blocks within an erase block region of the array "read only." In one embodiment of the invention, erase block regions of different sizes may exist. A fifth four bytes defines the type of erase blocking in one particular erase block region of an array. This information describes the number of erase blocks in an erase block region and the number of individual erase blocks in a region. Although only one erase block region is defined in the particular embodiment, additional space may be allotted to define additional erase block regions. By defining the number and sizes of different erase blocks that exist in the array, a software driver may be apprised of different areas that may be made "read only" or that may be erased in a single operation.

A next variable portion of the information returned in response to a query command is related to a particular vendor. In the present embodiment, a first three bytes of this information contains a designation that this data is the primary command set by returning the ASCII designation "PRI." A next two bytes includes the major and minor version numbers of the particular vendor command set. A next four bytes indicates particular features and commands that are supported by this vendor. For example, this portion may describe whether chip erase, suspend erase, suspend write, locked blocks, and queued erase (in which a number of erase operations are handled sequentially) are supported among other features. A next byte is used to specify whether features such as write are supported after a suspend operation. Although they might also be specified, read array, status, and query commands are always supported and thus need not be separately indicated. A next two bytes are used to indicate those functions that may be designated by a block status register. Such functions include whether the block may be locked and whether a block valid bit is included. Two additional bytes are used in the embodiment illustrated to describe optimum voltages for normal operation and for writing and erasing the block. Additional space may be allotted for other values, and a variable region is reserved for that data.

Finally, at an offset previously designated by the address "A," an alternate extended query structure may be placed. This may allot three bytes to a designation (such as ASCII "ALT") to indicate that the bits designate the alternate extended query structure. Like the primary structure discussed above, two bytes are also allotted to define the major and minor version number of the command defined. The length of the alternate query structure is variable depending on the particular data desired to be conveyed by the structure. The particular embodiment includes no alternate structure but simply reserves the space.

All of these values discussed above with respect to FIG. 4 are used to initialize the low level driver used with the particular flash memory device 27 so that it may efficiently deal with the array.

Once the device drivers have been initialized to the values of the particular flash memory device 27, various commands may be used and the flash memory device 27 will accept those commands. The read/write sector commands issued by the disk file system cause similar operations as with the flash disk device 17 of FIG. 2 as the flash translation layer driver translates such disk commands into flash primitive commands executable by the low level driver. The proper translation of requests for data transfer of specific disk-primitive units, or sectors, into variable flash device specific block erasure and byte or buffer write commands is facilitated by the knowledge of the software drivers of the flash memory device of erase block sizes, erase block region sizes, write buffer size, and the size of the entire device array. The information provided by reading out the contents of the query ROM 31 allows the device drivers of the flash disk emulator to emulate various sizes of disk drives such as the electromechanical drive 16 or the flash disk drive 17 using any of combination of different flash memory devices 27 within a flash memory card or other flash memory array used within a flash disk emulator. Moreover, this information is even useful for simplifying the firmware within a flash disk drive 17 containing flash memory devices 27 implemented in the manner of the current invention such that the same firmware will allow the flash disk drive to be manufactured at a later date using newer flash memory devices with upgraded features or larger capacities.

The interface provided by the present invention is optimally devised to provide compatibility with both prior art flash devices and more advanced flash devices that may appear in the future without requiring modification.

For example, the interface is devised to allow both single byte write operations that conform to operations of prior art flash devices and multibyte write operations that conform to advanced flash devices and flash devices not yet designed. More particularly, these multibyte write operations may be scaled to as yet undecided but infinitely scaleable sequences of bytes that may be written by utilizing the interface of the present invention.

Such scaling may be accomplished in one embodiment of the present invention by utilizing at least a pair of write buffers 50 and 51 as is illustrated by the dashed line shown dividing the buffer 49 in FIG. 3. By using a pair of buffers each of which is capable of storing a selected plurality of bytes to be written, one buffer may be loaded with data to be written while data in the other buffer is being written to the flash device. This allows some variable number of bytes to be written since the ability to write from one buffer while loading the other may provide an unlimited selection of multibyte lengths. This allows the device drivers to load a plurality of bytes of write data in sequential order to the write buffers until a desired value is reached. By allowing multiple bytes to be written in this manner so long as they are written serially, the time required to set up the programming mode necessary for writing data to the flash device is amortized over a significant number of bytes and the overall speed of operation is thereby increased. An embodiment may also be designed to accomplish multibyte writes when a reduced value of write current is required by writing a number of bytes of data in parallel.

In order to allow flash devices capable of only single byte writes and other flash devices capable of different ranges of multibyte writes to be used with the same interface, the query information provided that indicates the maximum number of bytes that the particular flash device is capable of writing (see FIG. 4) is used to alert the device drivers of the abilities of the flash device. With this information, the device drivers are able to correctly transfer write data to the flash device.

In a similar manner, the interface is adapted to provide compatibility with both prior art flash devices and more advanced flash devices in the manner in which block erasures may be accomplished. As with multibyte writes, the ability to accomplish a number of block erasures once the flash device has been placed in condition to accomplish erasure of blocks is quite desirable because it allows the time required to set up the condition to be amortized over a number of operations thereby reducing the overall time to accomplish operations and increasing the speed of operation of the flash device.

The query information shown in FIG. 4 related to the number of erase block regions and the size and number of erase blocks in a regions is valuable in initializing the device drivers to handle advanced multiblock erase operations. In a manner similar to multiblock writes, multiblock erase operation may be accomplished by flash devices with characteristics adapted to handle such operations. One embodiment designed to accomplish such multiblock erasures in an arrangement that uses a reduced value of erase current is able to erase a number of blocks in parallel. Another embodiment designed to accomplish such multiblock erasures is an arrangement that uses erase block queuing of serially provided erase block addresses to accomplish multiblock erasures. These two features may be combined in advanced flash devices to allow queuing of multiple block erasures in parallel.

In order to allow multibyte writes and multiblock erasures to be controlled in adaptations of flash devices that may be used with the interface of the present invention without increasing the hardware necessary to allow such use, one embodiment of the invention has been devised to allow the use of the status registers for multiple purposes. This is accomplished by changing the output produced in response to a "read status register" command depending on the particular status of the operation. Normally, the command causes global information regarding the operations of the flash device to be produced. For example, in response to a normal "read status register" command, the bits provided indicate the status of the write state machine and the status of the write and the erase operations that the state machine typically controls. However, by writing a "buffer write" or an "erase queue" command, the status output provided is no longer the global output relating to the flash device but is rather an output particular to the particular command. For example, after a "buffer write" command, the status read indicates that a write buffer is presently available to receive additional writes to the flash device. Such a status is returned if a single buffer is all that the flash device provides and this buffer is not full or, alternatively, if the device provides a pair of write buffers so that one may be available to receive write data while data from the other is being written to the flash device. This allows the same write command to be used to write either single bytes to a device adapted to receive only single byte writes or a series of sequential write commands to be used to write multiple bytes where buffers allow such a result. The status returned indicates for a device to which only single byte may be written that the buffer is not available after a first byte; the status returned indicates for a flash device to which multiple bytes may be written that buffer space is available allowing the writes to be queued.

In a like manner, after an "erase queue" command has been provided and until the advent of another valid command, the status returned indicates whether an erase queue is presently available to receive additional erase commands to the flash device.

In order to provide different status outputs in response to distinct commands to the flash device, one embodiment of the invention actually uses different status registers such as the registers 45 and 46 illustrated in FIG. 3 and switches the output of the different registers to the status output lines in response to the different commands. In another embodiment, a single status register receives status that is sensitive to the context of the command preceding the presentation of the status.

The flash memory device commands also allow a portion of the array to be made "read only" for particular operations. Data stored in a "read only" erase block region of the array may then be read directly from the array in a mode in which data are accessed on a row and column basis. Such a "read only" portion of the array may be used to execute programs directly from the array.

In such a case, data are written to the flash memory device 27 in the typical manner through a device command interface 40 shown in FIG. 3 that includes state machines for accomplishing the various accessing and control operations. Interface 40 is associated with a write state machine 41 used with each chip for writing, copying, and erasing the blocks of flash memory. However, when the data for direct code execution is written, the blocks 48 in which the data are stored are marked as "read only." This causes the application instructions in the blocks to remain in file order rather than to become discontiguously arranged. Consequently, the file need not be reassembled externally before the instructions are executed. Then a read of the instructions constituting an application takes place in a separate read array mode of the flash memory device 27. This mode may be initiated by a read array command that causes the flash memory device 27 to function in the read array mode. Alternatively, a separate read array pin may be provided. The read array mode selection allows a processor or other bus master to directly read data from the flash memory device 27 by providing the appropriate chip, block, row, and column read addresses with the command.

When in this read array mode, the instructions stored in the array may be read from the array as rapidly as instructions are typically read from DRAM memory. For this reason, the array may be used not only to replace long term memory such as a rotating disk drive, but also to replace certain of the main memory functions where data are not rapidly changing but need only be read form the array.

In addition to the commands provided by the embodiment described herein, other commands might also be used with a flash memory device 27 or by other devices that use a flash memory array and return query data in accordance with the present invention. For example, the query command may also return data indicating whether erase, write, and copy functions may be suspended and for what other operations they may be suspended. Additional data that may be provided include whether a ready/busy signal is present. If the array is adapted to provide multibit cell storage, a query command may return data relating to the type of multibit storage including the number of bits per cell, whether error correction coding is used, and other characteristics. Other data returned by a query command may indicate that the array is functioning in a single bit mode, that the array is capable of functioning in a two-state mode or in another multi-bit mode, and the number of bits stored in each cell in any such multi-bit mode. In this way, the interface may be used with flash memory devices that allow a single bit or a plurality of bits to be stored by memory cells. A query response might also indicate to a processor whether the array implements error detection and correction in storing and retrieving data. Other responses to a query command might indicate the type of logical drive the array constitutes (e.g., the array is a PCMCIA or other type of drive) when the device command user interface and pin configuration is directly compatible with such a specification.

By using a query command that returns data indicating the physical properties of the array, the interface allows optimal array device driver initialization to match the physical properties of the array. The CPU in a system with such an interface may read the results of the query command to determine how to interface to any flash memory device placed in the system. By utilizing a command set that is fixed, a query command provides responses that may be used by all vendors in an industry yet may be updated for future devices without rewriting the low level device drivers used with such devices.

In the foregoing specification, the invention has been described with reference to specific exemplary embodiments thereof. It will, however, be evident that various modifications and changes may be made therein without departing from the broader spirit and scope of the invention as set forth in the appended claims. For example, it should be clear that such an interface may be used, not only with flash disk drives and flash disk emulators, but with other devices that include flash EEPROM memory arrays. The specification and drawings are, accordingly, to be regarded in an illustrative rather than a restrictive sense.

What is claimed is:

1. A memory system comprising:
   a flash memory device;
   a query memory residing within the flash memory device which stores data defining a parameter of the flash memory device;
   a memory storing a software configured to execute multibyte write and multiblock erase operations;
   a status register with an output that varies based on a particular operation being executed; and
   a software driver coupled to the flash memory device to receive the data defining the parameter of the flash memory device.

2. The memory system of claim 1 wherein the query memory stores data defining a maximum number of bytes the flash memory device can write.

3. The memory system of claim 1 wherein the query memory stores data defining a number of erase block regions the flash memory device is capable of erasing.

4. The memory system of claim 1 wherein the query memory stores data defining a size and number of erase blocks in a region.

5. The memory system of claim 1 wherein the output of the status register indicates the availability of a write buffer during the time a write operation is being executed.

6. The memory system of claim 1 wherein the output of the status register indicates the availability of an erase queue to receive additional erase commands to the flash memory device during the time an erase operation is being executed.

7. A method of executing a multibyte write operation to a flash memory device comprising:
   alerting a software driver of a write parameter of the flash memory device stored in a query memory residing within the flash memory device, the alerting performed in response to a query command decoded by a command interface;
   transferring a plurality of bytes of write data to the flash memory device based on the write parameter of the device; and
   changing an output of a status register to indicate a status of a particular operation being executed.

8. The method of claim 7 wherein transferring write data to the flash memory device further comprises using a first buffer to store a queue of data to be written to the flash memory device and using a second buffer to write data to the flash memory device.

9. The method of claim 7 wherein transferring write data to the flash memory device further comprises writing a number of bytes of data in parallel.

10. The method of claim 7 wherein changing the output to the status register further comprises providing an output particular to a write command.

11. The method of claim 10 further comprising returning a status indicating the availability of a write buffer.

12. The method of claim 7 wherein alerting a software driver further comprises providing information from the query memory indicating a maximum number of bytes the flash memory device is capable of writing.

13. A method of executing a multiblock erase operation of a flash memory device comprising:
   alerting a software driver of an erase parameter of the flash memory device stored in a query memory residing within the flash memory device, the alerting performed in response to a query command decoded by a command interface;
   erasing multiple blocks of flash memory; and
   changing an output of a status register to indicate a status of a particular operation being executed.

14. The method of claim 13 wherein erasing multiple blocks of flash memory further comprises queuing erase block addresses.

15. The method of claim 13 wherein erasing multiple blocks of flash memory further comprises erasing a number of blocks in parallel.

16. The method of claim 13 wherein changing the output to the status register further comprises providing an output particular to an erase command.

17. The method of claim 16 further comprising returning a status indicating the availability of an erase queue to receive additional erase commands to the flash memory.

18. The method of claim 13 wherein alerting a software driver further comprises providing information from the query memory indicating a number of erase block regions the flash memory device is capable of erasing.

19. The method of claim 18 wherein alerting a software driver further comprises providing information from the query memory indicating a size and number of erase blocks in a region.

20. A machine readable media having stored thereon a sequence of commands which when executed by a processor cause the processor to perform the following:
   alerting a software driver of a write parameter of the flash memory device stored in a query memory residing within the flash memory device, the alerting performed in response to a query command decoded by a command interface;
   transferring a plurality of bytes of write data to the flash memory device based on the write parameter of the device; and
   changing an output of a status register to indicate a status of a particular operation being executed.

21. The computer readable media of claim 20 wherein transferring write data to the flash memory device further comprises using a pair of write buffers such that a first buffer stores a queue of data to be written to the flash memory device and a second buffer writes data to the flash memory device.

22. The computer readable media of claim 20 wherein transferring write data to the flash memory device further comprises writing a number of bytes of data in parallel.

23. The computer readable media of claim 20 wherein changing the output to the status register further comprises providing an output particular to a write command.

24. The computer readable media of claim 23 further comprising returning a status indicating the availability of a write buffer.

25. The computer readable media of claim 20 wherein alerting a software driver further comprises providing information from the query memory indicating a maximum number of bytes the flash memory device is capable of writing.

26. A computer readable media having stored thereon a sequence of commands which when executed by a computer system cause the computer system to perform the following:
   alerting a software driver of an erase parameter of the flash memory device stored in a query memory residing within the flash memory device, the alerting performed in response to a query command decoded by a command interface;
   erasing multiple blocks of flash memory; and
   changing an output of a status register to indicate a status of a particular operation being executed.

27. The computer readable media of claim 26 wherein erasing multiple blocks of flash memory further comprises queuing erase block addresses.

28. The computer readable media of claim 26 wherein erasing multiple blocks of flash memory further comprises erasing a number of blocks in parallel.

29. The computer readable media of claim 26 wherein changing the output to the read status register command further comprises providing an output particular to an erase command.

30. The computer readable media of claim 29 further comprising returning a status indicating the availability of an erase queue to receive additional erase commands to the flash memory.

31. The computer readable media of claim 26 wherein alerting a software driver further comprises providing information from the query memory indicating a number of erase block regions the flash memory device is capable of erasing.

32. The computer readable media of claim 31 wherein alerting a software driver further comprises providing information from the query memory indicating a size and number of erase blocks in a region.

* * * * *